US008837134B2

(12) United States Patent
Huang (10) Patent No.: US 8,837,134 B2
(45) Date of Patent: Sep. 16, 2014

(54) SIDE-PUSH TYPE RETRACTABLE USB MEMORY STICK

(75) Inventor: Joseph Huang, Taoyuan (TW)

(73) Assignee: Ho E Screw & Hardware Co., Ltd., Lu-Chu, Taoyuan (TW)

( * ) Notice: Subject to any disclaimer, the term of this patent is extended or adjusted under 35 U.S.C. 154(b) by 350 days.

(21) Appl. No.: 13/290,019

(22) Filed: Nov. 4, 2011

(65) Prior Publication Data

US 2013/0114201 A1 May 9, 2013

(51) Int. Cl.
*H05K 1/00* (2006.01)
*G06F 1/16* (2006.01)
*H05K 5/02* (2006.01)
*G06F 3/046* (2006.01)

(52) U.S. Cl.
CPC ............ *H05K 5/0278* (2013.01); *G06F 1/1613* (2013.01); *G06F 3/046* (2013.01)
USPC .................................. 361/679.31; 312/223.2

(58) Field of Classification Search
CPC .................. H05K 5/0278; H05K 2201/10446; H05K 1/0215; H05K 1/141; H05K 9/0007; H05K 9/0075; H05K 1/0259; H05K 1/0298; H05K 1/0939; H05K 2201/09763; H05K 5/0217; H05K 5/0247; G06K 19/07732; G06K 19/077; G06F 1/16; G06F 1/1635; G06F 1/1656; G06F 3/0614; G06F 3/0683; G06F 3/0689; G06F 13/409; G06F 1/1613; G06F 3/046
USPC ............. 361/679.31–679.39, 679.02, 679.01, 361/679.55–679.58, 679.3, 724–727, 719, 361/713–715, 722, 728, 730, 732, 740, 741, 361/747, 748, 754, 759, 752, 761; 312/223.1–223.2
See application file for complete search history.

(56) References Cited

U.S. PATENT DOCUMENTS

| | | | |
|---|---|---|---|
| 7,004,780 B1 * | 2/2006 | Wang | 439/353 |
| 7,269,003 B1 * | 9/2007 | Chung | 361/679.33 |
| 7,359,208 B2 * | 4/2008 | Ni | 361/752 |
| 8,043,099 B1 * | 10/2011 | Ni et al. | 439/131 |
| 8,081,483 B2 * | 12/2011 | Huang | 361/752 |
| 8,192,211 B1 * | 6/2012 | Huang | 439/131 |
| 8,508,921 B2 * | 8/2013 | Su | 361/679.01 |
| 2009/0147460 A1 * | 6/2009 | Kung | 361/679.31 |
| 2009/0323296 A1 * | 12/2009 | Sanzone | 361/752 |

* cited by examiner

*Primary Examiner* — Anthony Haughton
*Assistant Examiner* — Ingrid Wright
(74) *Attorney, Agent, or Firm* — Guice Patents PLLC (57) ABSTRACT

A side-push retractable USB memory stick includes a PC board providing a data storage function, an insulative PC board holder accommodating the PC board and having a springy plate located on one lateral side thereof and a press portion outwardly protruded from the springy plate, a housing surrounding the insulative PC board holder and having a sliding slot located on one lateral side thereof for receiving the press portion and enabling the press portion to be operated by an external force to move a metal shield and a USB interface circuit of the PC board in and out of a front opening of the housing. A rear end block closed on a rear open side of the housing, and a front end block press-fitted into the front opening and defining a through hole for passing the metal shield and the USB interface circuit in and out of the housing.

10 Claims, 8 Drawing Sheets

SIDE-PUSH TYPE RETRACTABLE USB MEMORY STICK

BACKGROUND OF THE INVENTION

1. Field of the Invention

The present invention is a retractable USB memory stick and more particularly, to such a side-push type retractable USB memory stick connectable to a computer for data access.

2. Description of the Related Art

USB memory stick is a mobile data storage device connectable to a computer for data access and convenient for carrying. Following fast development of technology, the storage capacity and application range of USB memory stick have been greatly improved.

Conventional USB memory sticks commonly uses a housing to house a PC board having a data storage function, and a USB interface circuit surrounded by a metal shield and extending out of the front open side of the housing for insertion into a USB slot of a computer.

As the metal shield protected USB interface circuit of a conventional USB memory stick protrudes over the front open side of the housing, it tends to be impacted accidentally. To eliminate this problem, retractable USB memory sticks are developed. Conventionally, a retractable USB memory stick uses an insulative PC board holder to hold a PC board having a USB interface circuit and a memory IC package, and a housing to accommodate the insulative PC board holder. The insulative PC board holder is operable to move the USB interface circuit in and out of the housing.

However, conventional retractable USB memory sticks are still not satisfactory in function. Due to structural design limitations, conventional retractable USB memory sticks have the drawbacks of poor closeness and operation inconvenience (such as rotary operation design), or complicated assembly process (such as push type design).

SUMMARY OF THE INVENTION

The present invention has been accomplished under the circumstances in view. It is therefore the main object of the present invention to provide a side-push type retractable USB memory stick, which eliminates the drawbacks of the conventional designs.

To achieve this and other objects of the present invention, a side-push type retractable USB memory stick comprises a PC providing a data storage function, an insulative PC board holder, a housing, a front end block and a rear end block. The PC board comprises a USB interface circuit located on the front side thereof and a metal shield surrounding the USB interface circuit. The insulative PC board holder comprises an accommodation chamber that accommodates the PC board, a front opening defined in one end of the accommodation chamber for enabling the metal shield of said PC board to extend out of the insulative PC board holder, a reduced rear close end located on the opposite end of the accommodation chamber, a springy plate located on one lateral side of the accommodation chamber, and a press portion outwardly protruded from the springy plate. The housing surrounds the insulative PC board holder, comprising a front opening and a rear opening respectively located on opposing front and rear sides thereof, and a sliding slot located on one lateral side thereof for receiving said press portion of said insulative PC board holder for enabling the press portion of the insulative PC board holder to be operated by an external force to move the metal shield and USB interface circuit of the PC board in and out of the front opening of the housing. The rear end block is press-fitted into the rear opening of the housing, defining therein a recessed chamber for accommodating the reduced rear close end of the insulative PC board holder. The front end block is press-fitted into the front opening of the housing, defining a through hole for the passing of the metal shield and USB interface circuit of the PC board toward the inside or outside of the housing.

Further, the PC board comprises a plurality of notches located on the border edge thereof. The insulative PC board holder further comprises a plurality of locating blocks respectively engaged into the notches of the PC board.

Further, the housing comprises two rear punched plates respectively inwardly protruded from two opposite lateral sidewalls near the rear opening thereof and sloping in one direction, and two front punched plates respectively inwardly protruded from the two opposite lateral sidewalls near the front opening thereof and sloping in an opposite direction. The rear end block comprises two recessed portions respectively disposed at two opposite lateral sides thereof and respectively forced into engagement with said rear punched plates of the housing. The front end block comprises two recessed portions respectively disposed at two opposite lateral sides thereof and respectively forced into engagement with the front punched plates of the housing.

Further, the sliding slot of the housing comprises a front crossed slot and a rear crossed slot. The front crossed slot comprises opposing top and bottom locating slot portions. The rear crossed slot comprises opposing top and bottom locating slot portions. The press portion of the insulative PC board holder comprises a plurality of raised spots selectively positioned in the top and bottom locating slot portions of the front crossed slot or the top and bottom locating slot portions of the rear crossed slot. The metal shield and USB interface circuit of the PC board are extended out of the front opening of the housing when the raised spots of the press portion of the insulative PC board holder are positioned in the top and bottom locating slot portions of the front crossed slot. The metal shield and USB interface circuit of the PC board are received inside the housing when the raised spots of the press portion of the insulative PC board holder are positioned in the top and bottom locating slot portions of the rear crossed slot.

Further, the reduced rear close end of the insulative PC board holder is received in the recessed chamber of the rear end block when the raised spots of the press portion of the insulative PC board holder are selectively positioned in the top and bottom locating slot portions of the rear crossed slot.

As the front and rear sides of the housing are blocked by the front end block and the rear end block, the PC board is well protected, avoiding damage. By means of operating the press portion of the insulative PC board holder, the metal shield and USB interface circuit of the PC board can be positively moved in and out of the front opening of the housing Further, the side-push type retractable USB memory stick comprises a clip fastened to the housing. The clip comprises a double-beveled clamping plate, a mounting plate and a connection plate connected between the double-beveled clamping plate and the mounting plate. The mounting plate is inserted into the inside of the housing through a gap in between the rear opening of the housing and the rear end block. The double-beveled clamping plate comprises a ridge kept in contact with the outer surface of the housing.

Further, the mounting plate of the clip comprises two recessed portions. The housing further comprises two punch holes and two retaining plates respectively extended from the border edge of each punch hole and respectively clamped on the recessed portions of the mounting plate of the clip. Further, the mounting plate of the clip comprises two locating blocks respectively disposed adjacent to the recessed portions for stopping the retaining plates of the housing in the recessed portions. Thus, the clip can be fastened to the housing conveniently with less effort and without any tool.

DETAILED DESCRIPTION OF THE PREFERRED EMBODIMENT

Figures 1, 1A:
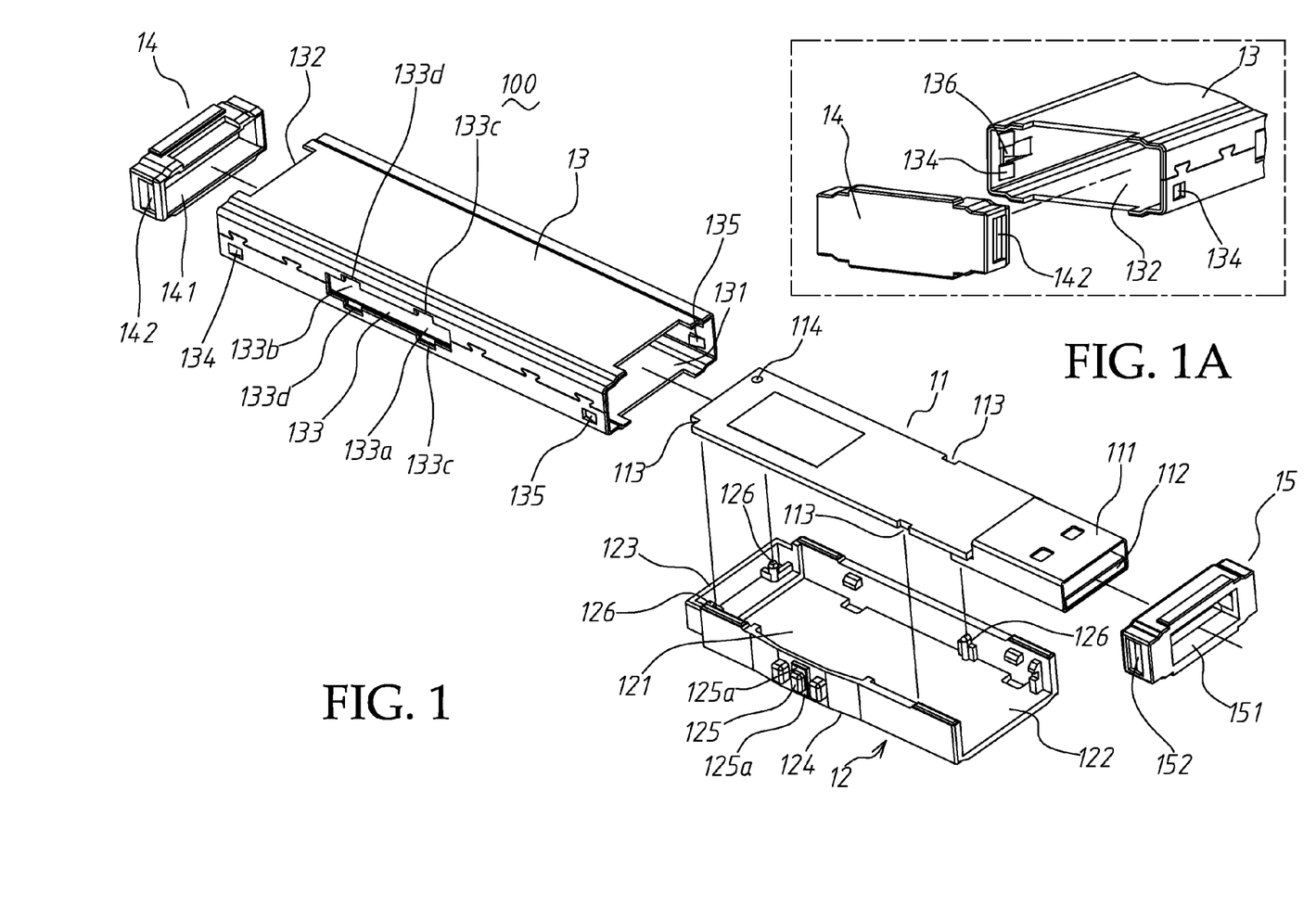
FIG. 1 is an exploded view of a side-push type retractable USB memory stick in accordance with a first embodiment of the present invention.
FIG. 1A is an enlarged view of a part of FIG. 1.
Figure 2:
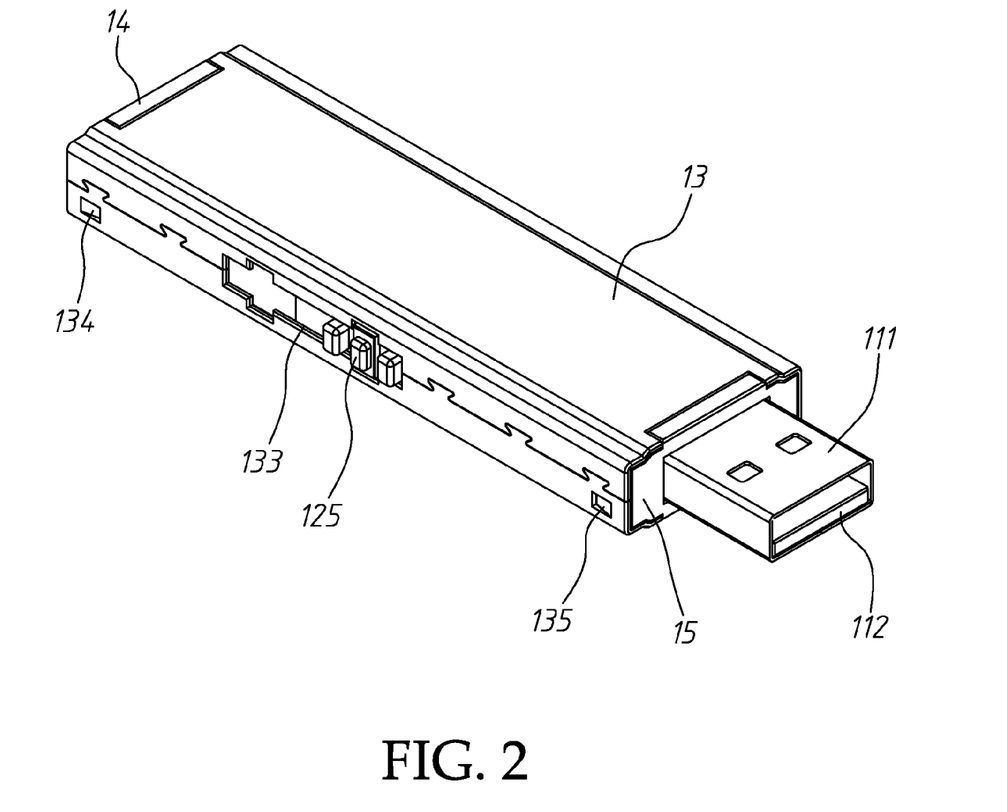
FIG. 2 is an elevational view of the side-push type retractable USB memory stick in accordance with the first embodiment of the present invention.
Figure 3:
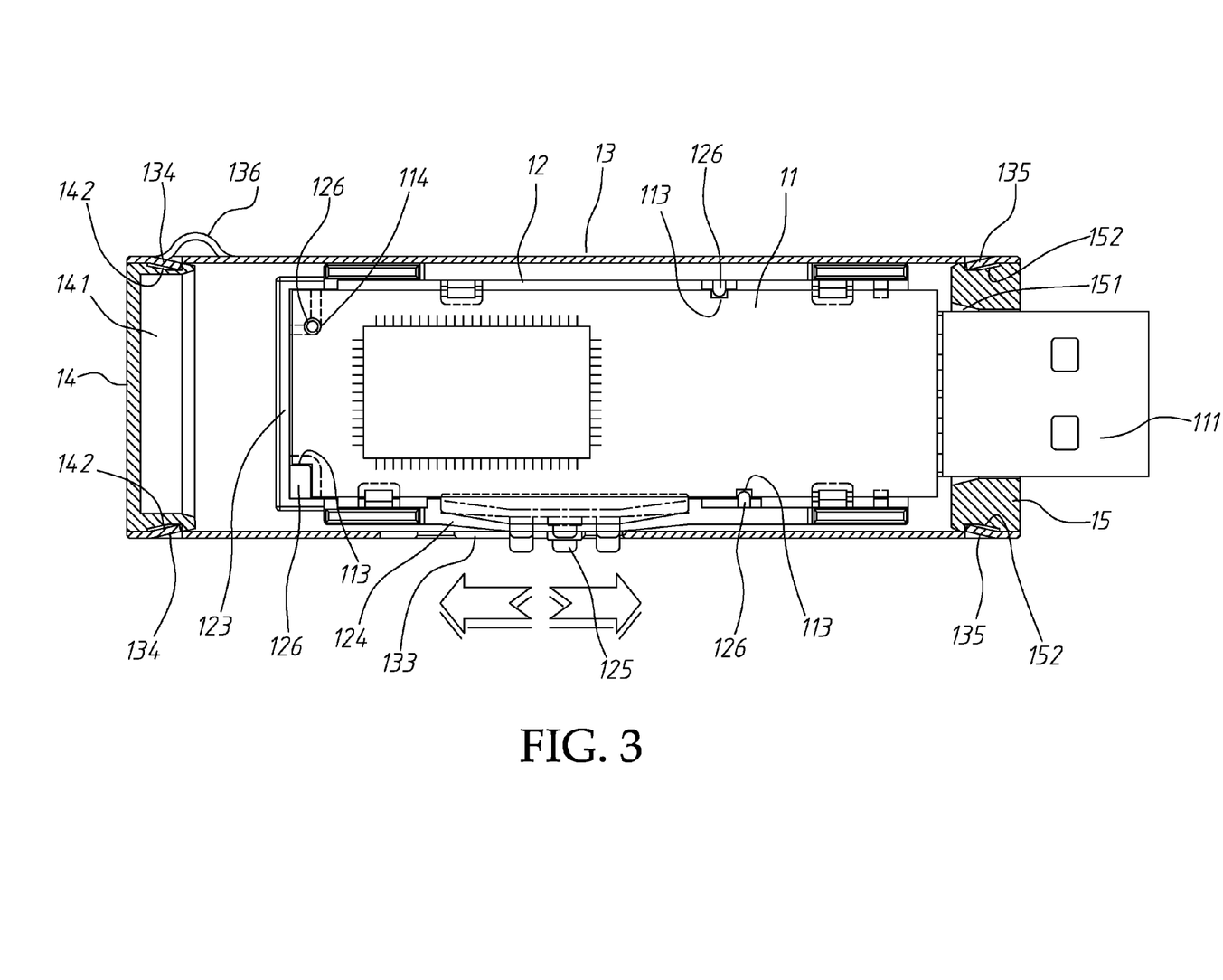
FIG. 3 is a sectional top view of the side-push type retractable USB memory stick in accordance with the first embodiment of the present invention.

Referring to FIGS. 1-3, a side-push type retractable USB memory stick 100 in accordance with a first embodiment of the present invention is shown comprising a PC board 11, an insulative PC board holder 12, a housing 13, a rear end block 14 and a front end block 15.

The PC board 11 provides a data storage function, comprising a USB interface circuit 112 located on the front side thereof, a metal shield 111 surrounding the USB interface circuit 112, a plurality of notches 113 on the border edge thereof, and a plurality of round holes 114 disposed near the border edge.

Figure 5:
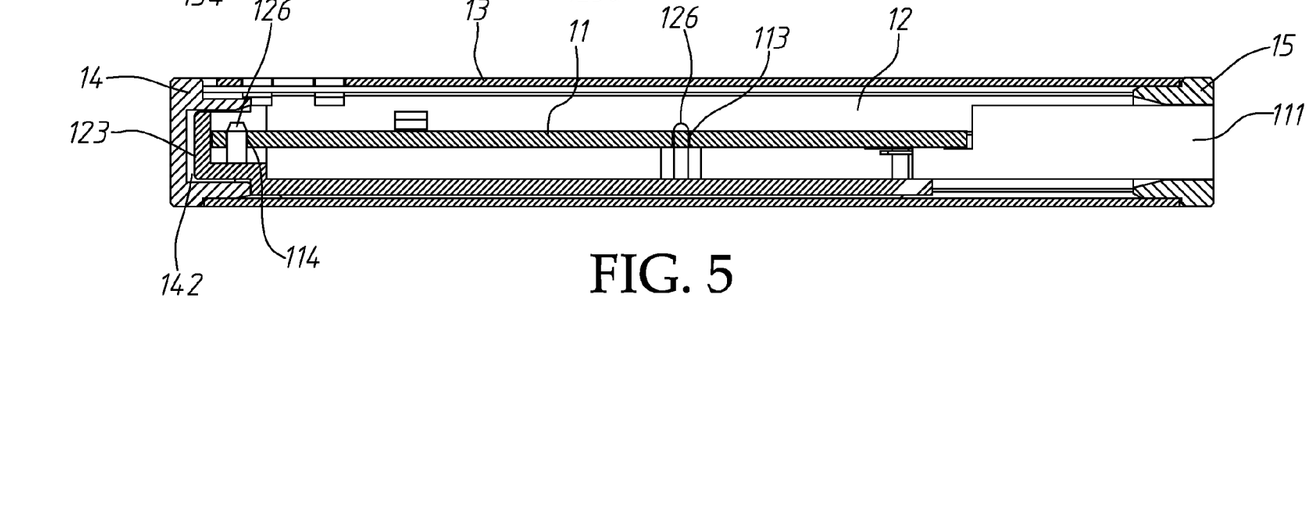
FIG. 5 is a sectional view of FIG. 4.

The insulative PC board holder 12 comprises an accommodation chamber 121 that accommodates the PC board 11, a front opening 122 defined in one end of the accommodation chamber 121 for enabling the metal shield 111 of the PC board 11 to extend out of the insulative PC board holder 12, a reduced rear close end 123 located on the opposite end of the accommodation chamber 121, a springy plate 124 located on one lateral side of the accommodation chamber 121, a press portion 125 outwardly protruded from the springy plate 124, and a plurality of locating blocks 126 bilaterally disposed in the accommodation chamber 121 and respectively engaged into the notches 113 and round holes 114 of the PC board 11 to secure the PC board 11 to the insulative PC board holder 12 firmly (see FIG. 5). The press portion 125 has three raised spots 125a respectively located on the middle and the opposing top and bottom sides.

Figure 4:
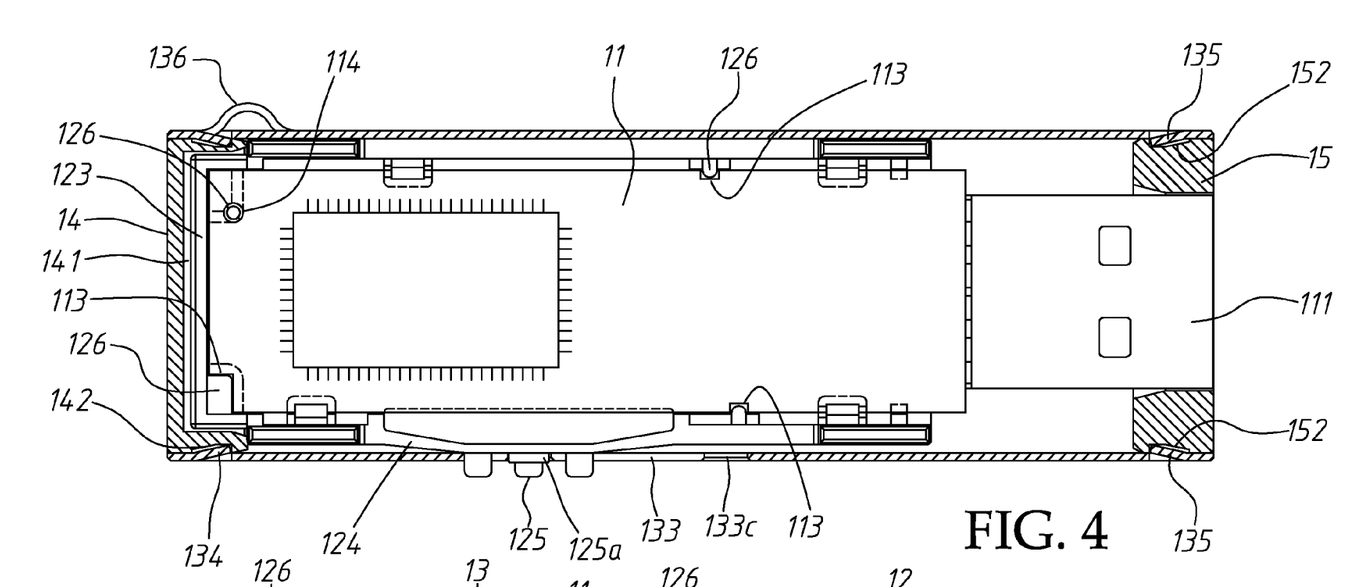
FIG. 4 corresponds to FIG. 3, illustrating the metal shield and USB interface circuit of the PC board received inside the housing.

The housing 13 surrounds the insulative PC board holder 12, comprising a front opening 131 and a rear opening 132 respectively located on opposing front and rear sides thereof, and a sliding slot 133 located on one lateral side thereof corresponding to the press portion 125 of the insulative PC board holder 12. As shown in FIGS. 2 and 3, the press portion 125 of the insulative PC board holder 12 extends out of the sliding slot 133 of the housing 13. The springy plate 124 is configured to impart a pressure to the press portion 125 when it is accommodated in the housing 13, forcing the press portion 125 to move in the sliding slot 133 of the housing 13 in direction away from the mid point of the sliding slot 133 toward the extended position where the metal shield 111 and USB interface circuit 112 of the PC board 11 extend out of the front opening 131 of the housing 13, as shown in FIG. 3, or the received position where the metal shield 111 and USB interface circuit 112 of the PC board 11 are received inside the housing 13, as shown in FIG. 4.

The rear end block 14 is press-fitted into the rear opening 132 of the housing 13, defining therein a recessed chamber 141. The front end block 15 is press-fitted into the front opening 131 of the housing 13, defining a through hole 151 for the passing of the metal shield 111 and USB interface circuit 112 of the PC board 11 toward the inside or outside of the housing 13.

Referring to FIG. 1A, the housing 13 comprises two rear punched plates 134 respectively inwardly protruded from the two opposite lateral sidewalls near the rear opening 132 and sloping in one direction, and two front punched plates 135 respectively inwardly protruded from the two opposite lateral sidewalls rear the front opening 131 and sloping in an opposite direction. The rear end block 14 comprises recessed portions 142 respectively disposed at the two opposite lateral sides thereof and respectively forced into engagement with the rear punched plates 134 of the housing 13, as shown in FIGS. 3 and 4. The front end block 15 comprises recessed portions 152 respectively disposed at the two opposite lateral sides thereof and respectively forced into engagement with the front punched plates 135 of the housing 13, as shown in FIGS. 3 and 4.

Further, the sliding slot 133 of the housing 13 is formed of a front crossed slot 133a and a rear crossed slot 133b. The front crossed slot 133a comprises opposing top and bottom locating slot portions 133c. The rear crossed slot 133b comprises opposing top and bottom locating slot portions 133d. The raised spots 125a of the press portion 125 of the insulative PC board holder 12 are selectively positioned in the top and bottom locating slot portions 133c of the front crossed slot 133a, or the top and bottom locating slot portions 133d of the rear crossed slot 133b. When the raised spots 125a of the press portion 125 of the insulative PC board holder 12 are selectively positioned in the top and bottom locating slot portions 133c of the front crossed slot 133a, as shown in FIG. 3, the metal shield 111 and USB interface circuit 112 of the PC board 11 are extended out of the front opening 131 of the housing 13. On the contrary, when the raised spots 125a of the press portion 125 of the insulative PC board holder 12 are selectively positioned in the top and bottom locating slot portions 133d of the rear crossed slot 133b, as shown in FIG. 4, the metal shield 111 and USB interface circuit 112 of the PC board 11 are received inside the housing 13. Further, when the raised spots 125a of the press portion 125 of the insulative PC board holder 12 are selectively positioned in the top and bottom locating slot portions 133d of the rear crossed slot 133b, the reduced rear close end 123 of the insulative PC board holder 12 is received in the recessed chamber 141 of the rear end block 14 and kept in position. Further, when pressing the press portion 125 of the insulative PC board holder 12, as indicated by the imaginary line in FIG. 3, the raised spots 125a of the press portion 125 of the insulative PC board holder 12 will be disengaged from the top and bottom locating slot portions 133c of the front crossed slot 133a or the top and bottom locating slot portions 133d of the rear crossed slot 133b, allowing the press portion 125 to be moved along the sliding slot 133 of the housing 13.

During installation, the PC board 11 is put in the insulative PC board holder 12 and then inserted with the insulative PC board holder 12 into the inside of the housing 13 to force the press portion 125 of the insulative PC board holder 12 into the sliding slot 133 of the housing 13, and then the front end block 15 and the rear end block 14 are respectively engaged into the front opening 131 and rear opening 132 of the housing 13 to force the recessed portions 142 of the rear end block 14 and the recessed portions 152 of the front end block 15 into engagement with the rear punched plates 134 and front punched plates 135 of the housing 13 respectively. This installation procedure is simple and rapid, saving much installation labor and cost.

As the front and rear sides of the housing 13 are blocked by the front end block 15 and the rear end block 14, the PC board 11 is well protected, avoiding damage. By means of operating the press portion 125 of the insulative PC board holder 12, the metal shield 111 and USB interface circuit 112 of the PC board 11 can be positively moved in and out of the front opening 131 of the housing 13.

Referring to FIG. 3 again, the housing 13 further comprises an eye lug 136 formed of a part of one lateral sidewall thereof and disposed near the rear opening 132 for the fastening of a cord member for hanging.

Figure 6:
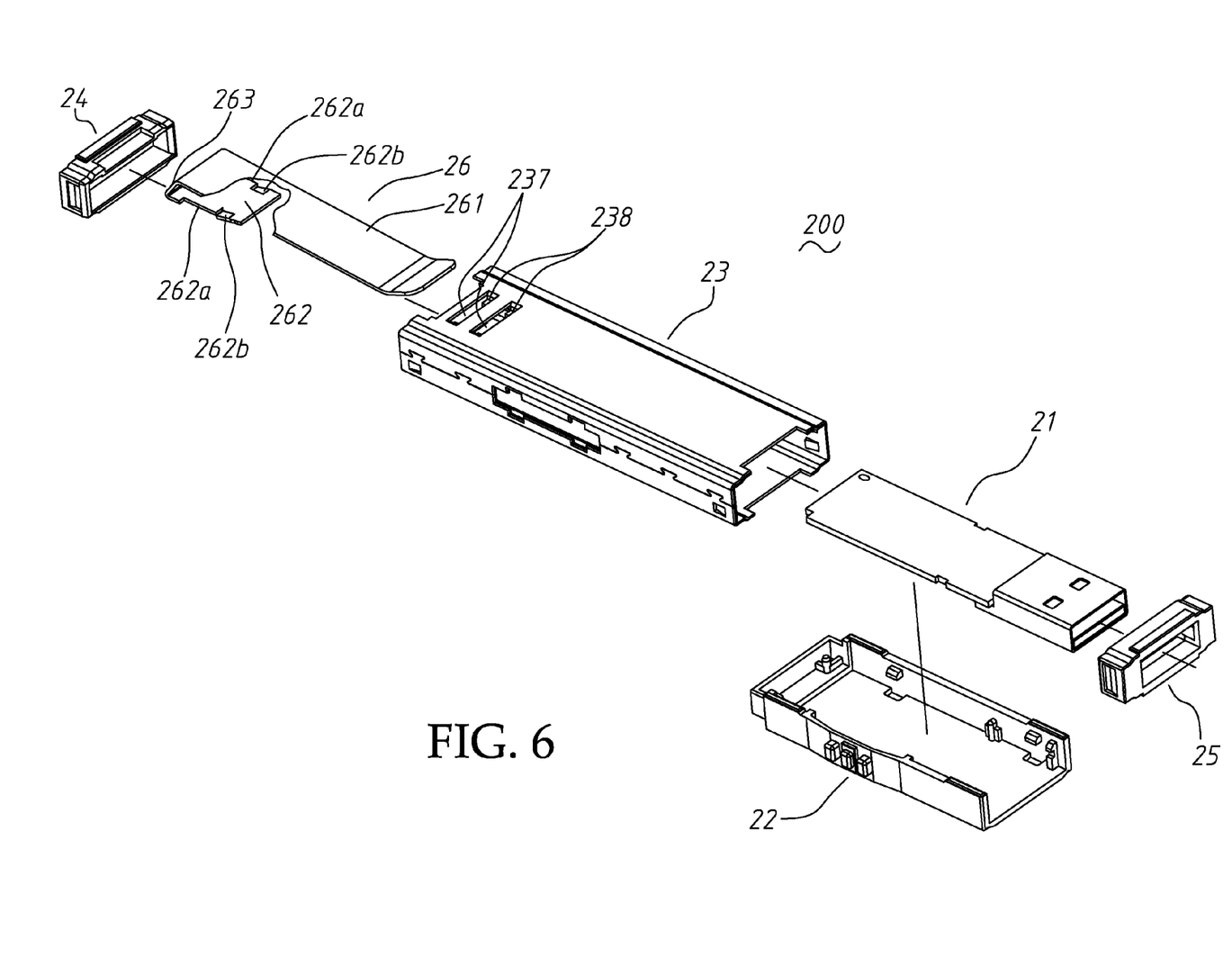
FIG. 6 is an exploded view of a side-push type retractable USB memory stick in accordance with a second embodiment of the present invention.
Figure 7:
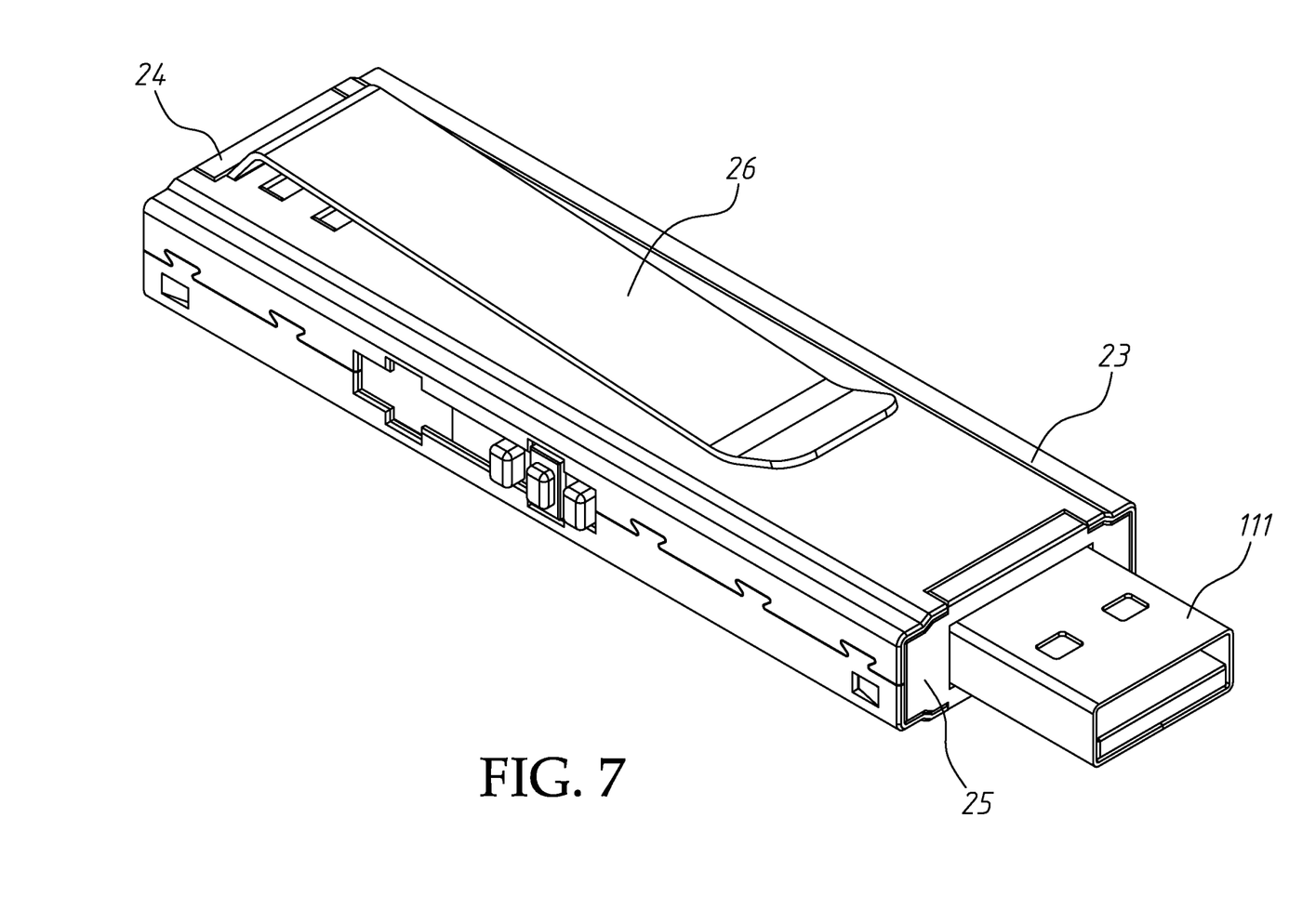
FIG. 7 is an elevational view of the side-push type retractable USB memory stick in accordance with the second embodiment of the present invention.
Figure 8:
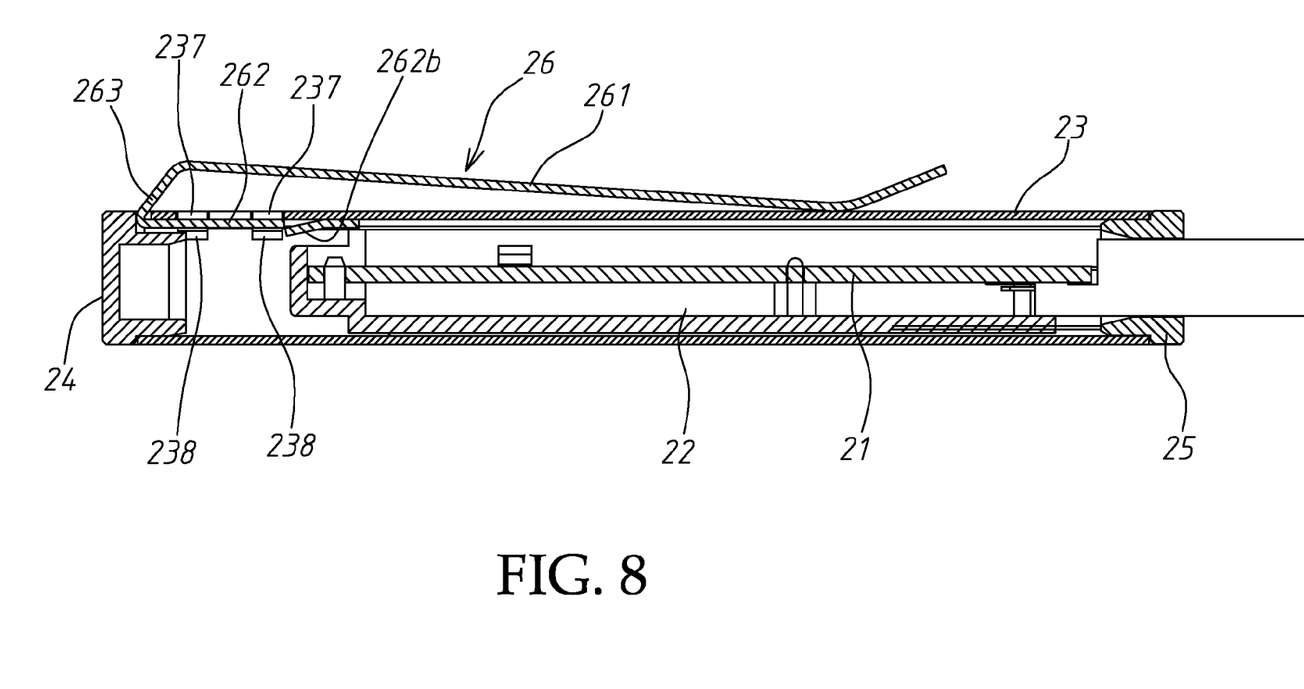
FIG. 8 is a sectional side view of the side-push type retractable USB memory stick in accordance with the second embodiment of the present invention.

FIGS. 6-8 illustrate a side-push type retractable USB memory stick 200 in accordance with a second embodiment of the present invention. Similar to the aforesaid first embodiment of the present invention, the side-push type retractable USB memory stick 200 also comprises a PC board 21, an insulative PC board holder 22, a housing 23, a rear end block 24 and a front end block 25. This second embodiment further comprises a clip 26.

The clip 26 comprises a double-beveled clamping plate 261, a mounting plate 262, and a connection plate 263 connected between the double-beveled clamping plate 261 and the mounting plate 262. The mounting plate 262 is inserted into the inside of the housing 23 through the gap in between the rear opening of the housing 23 and the rear end block 24. The double-beveled clamping plate 261 suspends outside the housing 23, keeping the lowest point (the ridge) of the double-beveled configuration thereof in contact with the outer surface of the housing 23 for clamping a thin sheet member on the outside wall of the housing 23.

Figure 9:
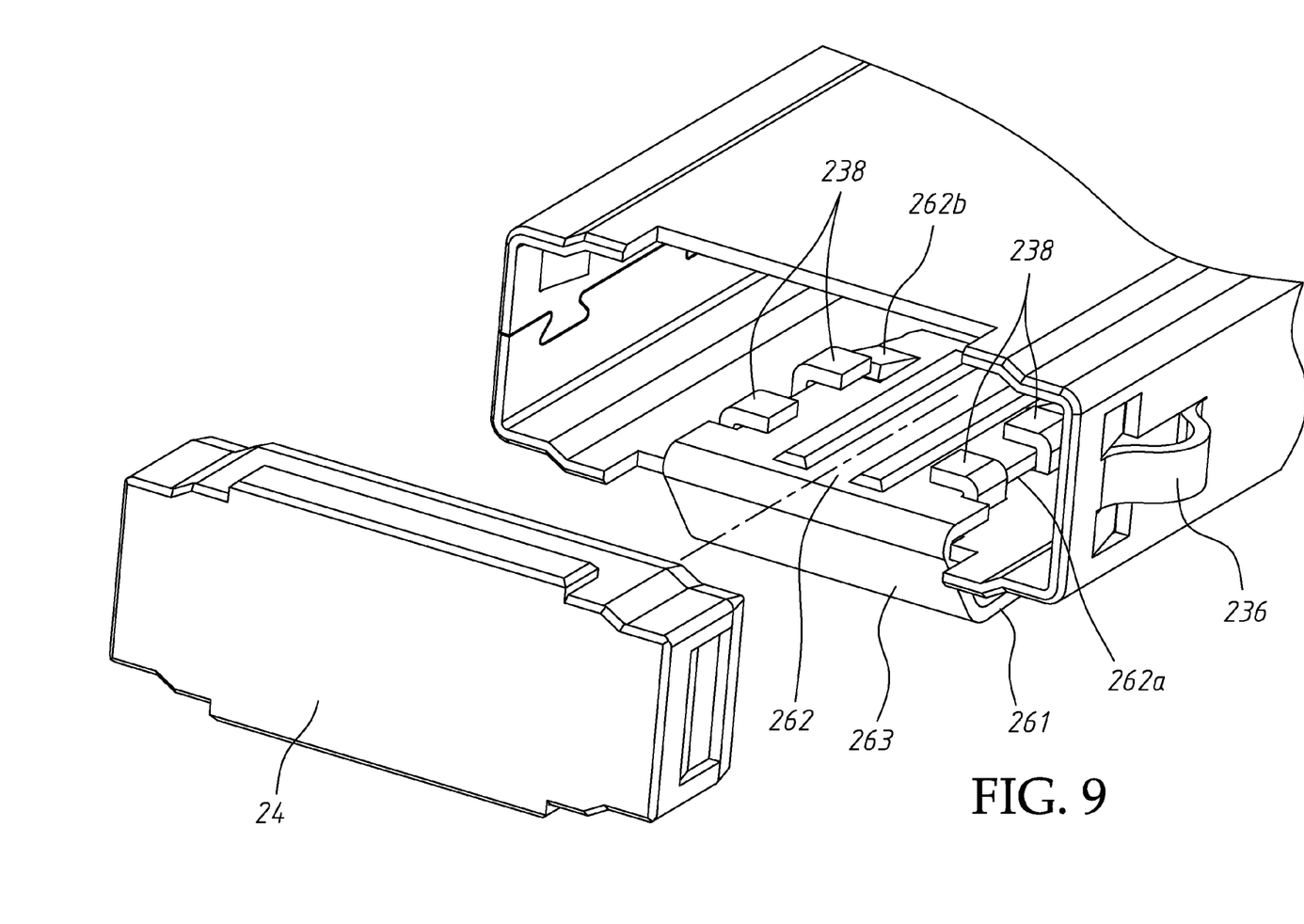
FIG. 9 is an exploded view, in an enlarged scale, of a part of the side-push type retractable USB memory stick in accordance with the second embodiment of the present invention, illustrating the relationship between the housing and the rear end block.

Referring to FIG. 9 and FIG. 8 again, the housing 23 further comprises two punch holes 237 and two retaining plates 238 respectively extended from a border edge of each of the two punch holes 237 and respectively clamped on respective recessed portions 262a of the mounting plate 262 of the clip 26. The mounting plate 262 further comprises two locating blocks 262b respectively disposed adjacent to the recessed portions 262a for stopping the retaining plates 238 of the housing 23 in the recessed portions 262a.

Further, the housing 23 comprises an eye lug 236 for the fastening of a cord member for hanging.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A side-push type retractable USB memory stick, comprising:
   a PC board providing a data storage function, said PC board comprising a USB interface circuit located on a front side thereof and a metal shield surrounding said USB interface circuit;
   an insulative PC board holder comprising an accommodation chamber that accommodates said PC board, a front opening defined in one end of said accommodation chamber for enabling said metal shield of said PC board to extend out of said insulative PC board holder, a reduced rear close end located on an opposite end of said accommodation chamber, a springy plate located on one lateral side of said accommodation chamber, and a press portion outwardly protruded from said springy plate;
   a housing surrounding said insulative PC board holder, said housing comprising a front opening and a rear opening respectively located on opposing front and rear sides thereof, and a sliding slot located on one lateral side thereof for receiving said press portion of said insulative PC board holder for enabling said press portion of said insulative PC board holder to be operated by an external force to move said metal shield and USB interface circuit of said PC board in and out of the front opening of said housing;
   a rear end block press-fitted into the rear opening of said housing, said rear end block defining therein a recessed chamber for accommodating said reduced rear close end of said insulative PC board holder, when said metal shield and said USB interface circuit of said PC board are located with said housing, said reduced rear close end of said insulative PC board holder and a rear end of said PC board are located in said recessed chamber of said rear end block; and
   a front end block press-fitted into the front opening of said housing, said front end block defining a through hole for the passing of said metal shield and USB interface circuit of said PC board toward the inside or outside of said housing.

2. The side-push type retractable USB memory stick as claimed in claim 1, wherein said PC board comprises a plurality of notches located through the border edge thereof; said insulative PC board holder further comprises a plurality of locating blocks respectively inserted through said notches of said PC board.

3. The side-push type retractable USB memory stick as claimed in claim 1, wherein said housing comprises two rear punched plates respectively inwardly protruded from two opposite lateral sidewalls near the rear opening thereof and sloping in one direction; said rear end block comprises two recessed portions respectively disposed at two opposite lateral sides thereof and respectively forced into engagement with said rear punched plates of said housing.

4. The side-push type retractable USB memory stick as claimed in claim 1, wherein said housing comprises two front punched plates respectively inwardly protruded from two opposite lateral sidewalls near the front opening thereof and sloping in one direction; said front end block comprises two recessed portions respectively disposed at two opposite lateral sides thereof and respectively forced into engagement with said front punched plates of said housing.

5. The side-push type retractable USB memory stick as claimed in claim 1, wherein said sliding slot of said housing comprises a front crossed slot and a rear crossed slot, said front crossed slot comprising opposing top and bottom locating slot portions, said rear crossed slot comprising opposing top and bottom locating slot portions; said press portion of said insulative PC board holder comprises a plurality of raised spots selectively positioned in the top and bottom locating slot portions of said front crossed slot or the top and bottom locating slot portions of said rear crossed slot;

said metal shield and said USB interface circuit of said PC board are extended out of the front opening of said housing when the raised spots of said press portion of said insulative PC board holder are positioned in the top and bottom locating slot portions of said front crossed slot; said metal shield and said USB interface circuit of said PC board are received inside said housing when the raised spots of said press portion of said insulative PC board holder are positioned in the top and bottom locating slot portions of said rear crossed slot.

6. The side-push type retractable USB memory stick as claimed in claim 5, wherein said reduced rear close end of said insulative PC board holder is received in said recessed chamber of said rear end block when said raised spots of said press portion of said insulative PC board holder are selectively positioned in the top and bottom locating slot portions of said rear crossed slot.

7. The side-push type retractable USB memory stick as claimed in claim 1, wherein said housing further comprises an eye lug located on one lateral sidewall near the rear opening thereof for the fastening of a cord member for hanging.

8. The side-push type retractable USB memory stick as claimed in claim 1, further comprising a clip fastened to said housing, said clip comprising a double-beveled clamping plate, a mounting plate and a connection plate connected between said double-beveled clamping plate and said mounting plate, said mounting plate being inserted into the inside of said housing through a gap in between the rear opening of said housing and said rear end block, said double-beveled clamping plate comprising a ridge kept in contact with an outer surface of said housing.

9. The side-push type retractable USB memory stick as claimed in claim 8, wherein said mounting plate of said clip comprises two recessed portions located on opposing edges of said mounting plate; said housing further comprises two punch holes and two retaining plates respectively extended from a border edge of each of said two punch holes and respectively clamped on said recessed portions located on opposing edges of said mounting plate of said clip.

10. The side-push type retractable USB memory stick as claimed in claim 9, wherein said mounting plate of said clip comprises two locating blocks respectively located on said two opposing edges of said mounting plate adjacent to said recessed portions for stopping the retaining plates of said housing in said recessed portions.

* * * * *